US005613367A

United States Patent [19]
Chen

[11] Patent Number: 5,613,367
[45] Date of Patent: Mar. 25, 1997

[54] CRYOGEN RECONDENSING SUPERCONDUCTING MAGNET

[75] Inventor: William E. Chen, Florence, S.C.

[73] Assignee: General Electric Company, Milwaukee, Wis.

[21] Appl. No.: 580,359

[22] Filed: Dec. 28, 1995

[51] Int. Cl.$^6$ .................................................. F17C 7/04
[52] U.S. Cl. ............................ 62/47.1; 62/51.1; 62/295
[58] Field of Search ............................... 62/51.1, 47.1, 62/295

[56] References Cited

U.S. PATENT DOCUMENTS

| | | | |
|---|---|---|---|
| 4,223,540 | 9/1980 | Longsworth | 62/51.1 |
| 4,578,962 | 4/1986 | Dustmann | 62/47.1 |
| 4,756,167 | 7/1988 | Kuriyama et al. | 62/51.1 |
| 4,765,153 | 8/1988 | Wachi | 62/51.1 |
| 4,777,807 | 10/1988 | White | 62/511 |
| 4,790,147 | 12/1988 | Kuriyama et al. | 62/47.1 |
| 4,796,433 | 1/1989 | Bartlett | 62/51.1 |
| 4,888,956 | 12/1989 | Murray | 62/51.1 |
| 5,018,359 | 5/1991 | Horikawa et al. | 62/51.1 |
| 5,092,130 | 3/1992 | Nagao et al. | 62/6 |
| 5,365,743 | 11/1994 | Nagao et al. | 62/47.1 |

*Primary Examiner*—Ronald C. Capossela
*Attorney, Agent, or Firm*—Irving M. Freedman; John H. Pilarski

[57] ABSTRACT

A helium cooled superconducting magnet assembly including helium gas recondensing apparatus to return liquid helium to the helium supply in the helium vessel includes a recondenser positioned in the helium vessel above the helium supply connected to a cryocooler in a dual-sleeve assembly enabling breaking of thermal joints with thermal isolation from the helium for servicing of the cryocooler during superconducting operation of the magnet assembly, and providing recondensing of helium gas to fall by gravity back to the helium supply.

17 Claims, 1 Drawing Sheet

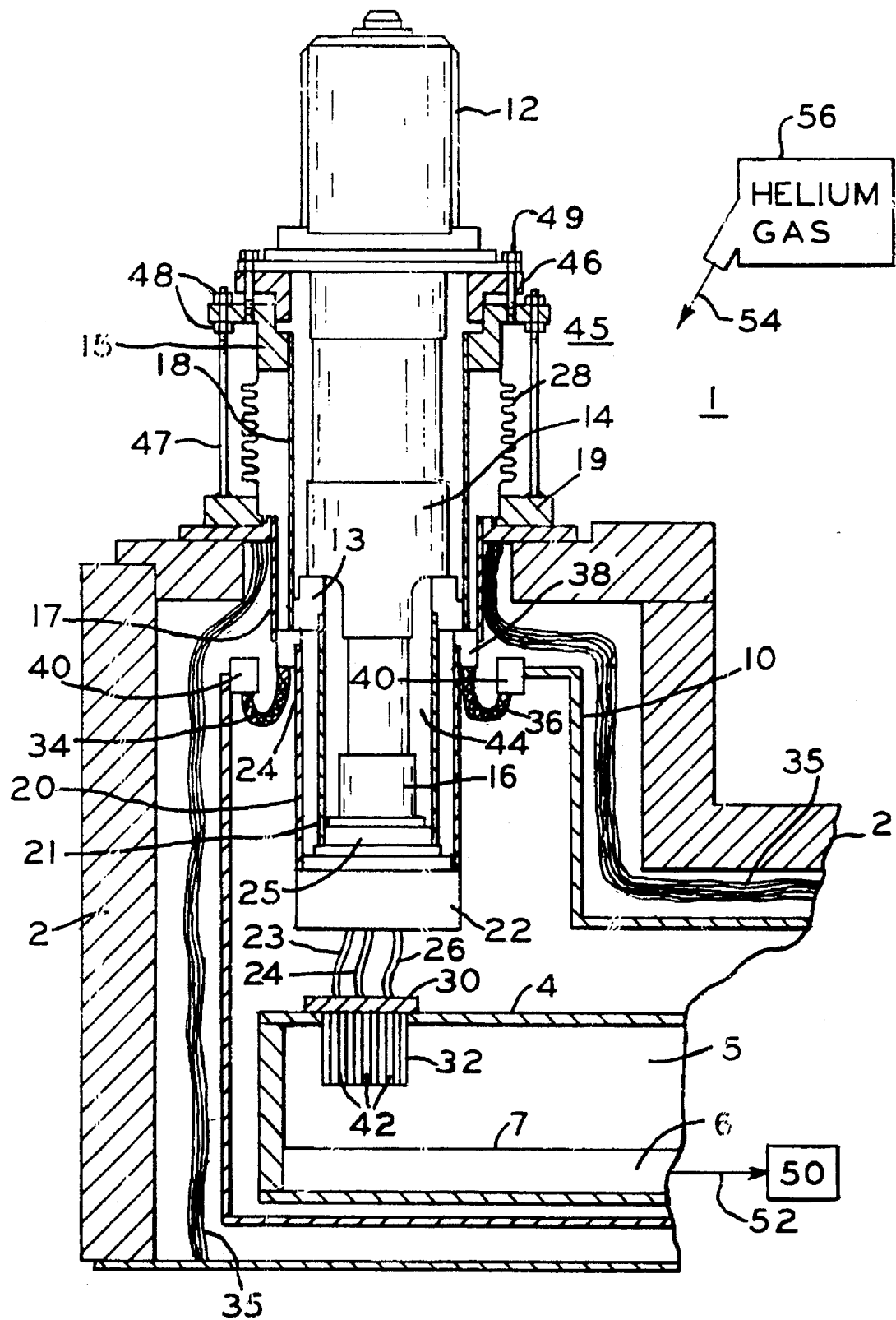
FIG_1

CRYOGEN RECONDENSING SUPERCONDUCTING MAGNET

BACKGROUND OF INVENTION

This invention relates to helium cooled superconducting magnet assemblies suitable for magnetic resonance imaging (hereinafter called "MRI"), and more particularly to an improved and simplified means within the helium vessel for recondensing the resultant helium gas back into liquid helium.

As is well known, a superconducting magnet can be made superconducting by placing it in an extremely cold environment, such as by enclosing it in a cryostat or pressure vessel containing liquid helium or other liquid cryogen. The extreme cold insures that the magnet coils are maintained in superconducting operation, such that when a power source is initially connected to the magnet coils (for a period, for example, of 10 minutes) to introduce a current flow through the coils, the current will continue to flow through the coils even after power is removed due to the absence of electrical resistance in the coils, thereby maintaining a strong magnetic field. Superconducting magnet assemblies find wide application in the field of MRI.

Considerable research and development efforts have been directed at minimizing the need to replenish the boiling cryogen such as liquid helium. While the use of liquid helium to provide cryogenic temperatures is widely practiced and is satisfactory for MRI operation the provision of a steady supply of liquid helium to MRI installations all over the world has proved to be difficult and costly.

As a result, it is highly desirable to efficiently minimize the amount of liquid helium required and to minimize or eliminate the need to continually replenish the liquid helium supply as the liquid helium boils in providing the superconducting temperature for the superconducting magnet assembly. It is common practice to vent the helium gas resulting from the boiling helium, and to periodically replenish the helium supply.

Another problem encountered in the use of liquid helium to provide cryogenic temperatures for superconducting magnet assemblies is in storing the necessary reserve supply of liquid helium at cryogenic temperatures of 4° K. (or close to absolute zero), and the related problem of periodically transferring a portion of the liquid helium in the storage reservoir to the liquid helium supply in the superconducting magnet.

Various attempts have been made to recycle the helium off-gas resulting from the boiling helium. They have not been entirely satisfactory. One difficulty encountered in the efforts to recondense helium gas has been that of access to, and servicing of, the recondensing equipment. It is extremely important that the MRI be maintained in operating condition if at all possible during any servicing of the recondensing equipment since discontinuance of superconducting operation to service the equipment can result in considerable down time and boiloff of the helium supply in the superconducting magnet assembly due to ramping down and the subsequent ramping up and shimming of the superconducting magnet to homogeneous superconducting operation. Such procedures are necessarily costly in time and material, not the least of which is the expense associated with the inability to utilize the expensive MRI equipment during the down time period.

One means of helium recondensing is disclosed in my copending patent application, entitled "Helium Recondensing Superconducting Magnet" filed Dec. 29, 1994, application Ser. No. 08/366,187 and assigned to the same assignee as the present invention.

The lack of thermal isolation between the cryocooler, the evacuated outer vessel, and the cold helium gas in the helium vessel has resulted in increased service time, higher cryogen consumption during service, and possible contamination of the recondensing contact surfaces and/or the cryocooler system. Accordingly, it is important to be able to avoid contamination and to provide recondensing equipment in which the cryocooler can be removed and serviced while maintaining superconducting operation of the superconducting magnet assembly and without upsetting the integrity of the vacuum in the outer vessel and the inner helium vessel.

OBJECTS AND SUMMARY OF INVENTION

It is an object of the present invention to provide an uncomplex improved cryogen recondensing superconducting magnet assembly with improved thermal efficiency.

It is another object of the present invention to provide an improved recondensing helium cooled superconducting magnet assembly utilizing a cryocooler which can be removed and serviced without discontinuing superconducting magnet MRI system operation.

In accordance with one form of the invention, a two stage cryocooler extends into the space between the helium vessel and the surrounding vacuum vessel in a superconducting magnet with its cold end or second stage thermally connected to a recondenser. The recondenser is positioned within the helium vessel above the liquid helium to directly contact the helium gas in the helium vessel with the recondensed helium falling by gravity directly back to the liquid helium reservoir.

More particularly, the first stage of the cryocooler is thermally connected to a radiation shield interposed between the helium vessel and the vacuum vessel through a flexible coupling extending between the first stage of the cryocooler and the radiation shield. The helium recondenser includes a plurality of recondensing surfaces which are directly thermally connected to the second stage of the cryocooler through a common thermal heat sink to recondense impinging helium gas back to liquid helium. The cryocooler extends within a dual-sleeve assembly in the magnet to enable its removal for servicing while maintaining the superconducting magnet in superconducting operation.

DESCRIPTION OF DRAWINGS AND INVENTION

FIG. 1 is a cross-section of an MRI superconducting magnet incorporating the present invention.

Referring to FIG. 1, MRI superconducting magnet system 1 includes helium vessel 4 surrounded by vacuum vessel 2 with intervening thermally isolating radiation shield 10 interposed between the helium vessel and the vacuum vessel. A 4K cryocooler 12 (which may be a 2 stage Gifford-Mahon cryocooler) extends through vacuum vessel 2 within sleeves 18, 21, 17 and 20 such that the cryocooler may be selectively positioned within the sleeve or removed without destroying the vacuum within vacuum vessel 2. First stage mobile sleeve 18 and stationary sleeve 17 surround first stage 14 of cryocooler 12 and second stage mobile sleeve 21 and stationary sleeve 20 surround second stage 16 of the cryocooler. Cryocooler inner mobile sleeve 18, 13, 21, 25 and stationary sleeve 17, 38, 20, 22 extend outside vacuum vessel 2 past collar 19 to sleeve flange 15 isolating cryocooler 12 from vacuum vessel 2. Cryocooler 12 is installed in cryocooler sleeves 18, 21, 17 and 20 with a matching transition flange 46 and secured with bolts and washers such as 49 to sleeve flange 15.

First stage heat station 14 of cryocooler 12 contacts copper heat station of the first stage mobile sleeve or heat sink 13 and the heat station of the stationary sleeve or heat station 28 which are thermally connected through braided copper flexible thermal couplings 34 and 36 to isolating radiation shield 10 through connection to copper thermal blocks 40 on the radiation shield to cool the radiation shield to a temperature of approximately 50° K. and provide thermal isolation between helium vessel 4 and vacuum vessel 2. Flexible couplings 34 and 36 also provide mechanical or vibration isolation between cryocooler 12 and radiation shield 10.

Copper second stage heat station of the stationary sleeve or heat sink 22 at the bottom or inner portion of second stage cryocooler stationary sleeve 20 contacts the bottom surface 25 of second stage mobile sleeve 21 and to the second stage heat station 16 of cryocooler 12 to efficiently provide a temperature of 4K to heat sink 22.

Extending into helium vessel 4 and thermally connected to recondenser heat sink 30 is helium recondensing heat transfer surfaces or recondenser 32 which includes a plurality of substantially parallel heat transfer surfaces or fins such as 42 in thermal contact with the recondenser heat sink which is in turn connected thermally through flexible copper braids 23, 24 and 26 to second stage heat sink 22 positioned above helium vessel 4.

Helium gas 5 which forms above surface level 7 of cryogen or liquid helium supply 6 through the boiling of the liquid helium in providing cryogenic temperatures to MRI magnet system 1 directly contacts heat transfer plates 42 within helium vessel 4 to be cooled back to 4K by the thermal connection described above to second stage 16 of cryocooler 12. Helium gas 5 will recondense into liquid helium on heat transfer plates 42 to drop by gravity back to the liquid helium supply within the helium vessel.

As a result, during operation of MRI magnet system 1 liquid helium 6 cools superconducting magnet coil assembly shown generally as 50 and positioned within helium vessel 4 with the cooling indicated generally as arrow 52 in the manner well known in the MRI art, resulting in boiling of liquid helium 6 and production of helium gas 5 above surface level 7 of the liquid helium. However, helium gas 5 instead of being vented to the atmosphere as is common in many MRI equipments, contacts helium recondensing heat transfer plates or surfaces 42 within helium vessel 4 which is maintained at a temperature of 4K by second stage 16 of cryocooler 12 such that the helium gas recondenses back to liquid helium which drops by gravity directly back to liquid helium supply 6, thus recondensing and returning the helium gas back to the liquid helium supply as liquid helium with a minimum of connections which could introduce thermal heating or helium flow obstruction.

To further themally isolate helium vessel 4 from vacuum vessel 2, in addition to the cooling of radiation shield 10 by first stage 14 of cryocooler 12, superinsulation 35 is provided in the space between radiation shield 10 and vacuum vessel 2. Superinsulation 35 is aluminized Mylar multi-layer insulation used in the superconducting magnet industry.

Items 15, 18, 13, 21 and 25 are silver soldered at their respective joints to form a mobile sleeve around the first and second stages of cryocooler 12 in vacuum during normal operation of magnet system 1. An outer stationary sleeve assembly including sleeves 17, 38, 20 and 22 form another cavity separating the interior of vacuum vessel 2 from atmosphere or ambient air 45 surrounding superconducting magnet 1. This enables the breaking of thermal joint 13, 38 around the first stage 14 of cryocooler 12 and thermal joint 25, 22 around the second stage of the cryocooler by mechanically moving the cryocooler and mobile sleeve together away from the stationary sleeve without breaking the vacuum integrity using a stretchable bellows 28 upon the loosening of nuts 48 on threaded rods 47. This thermally isolates heat sinks 13 from 38 and 22 from 25 due to the vacuum space between them allowing cryocooler 12 to be removed and serviced without introducing excess heat leakage to helium vessel 4 which could upset the superconducting operation of superconducting magnet 1.

When cryocooler 12 has been repaired or a replacement is made available and is ready for reassembly and insertion into mobile sleeve 15, 18, 13, 21, 25, the heat sinks or heat stations 13 and 25 can be warmed to room temperature, wiped cleaned and any condensate removed after blowing helium gas 54 at room temperature from an external helium gas supply shown generally as 56 over the heat sinks to warm them up.

Heat sinks 13 and 25 are thus thermally isolated from helium 6 by the dual generally concentric sleeve assembly preventing the icing of heat sinks 13 and 25 upon the removal of cryocooler 12 which would interfere with good thermal connections at joints 13, 14 and 25, 16 upon reinsertion and reassembly of cryocooler 12. Thus continued superconducting operation of magnet 1 without liquid helium 6 boiloff and prevention of icing and ability to clean of heat sinks 13 and 25 before reinsertion of cryocooler 12 is made possible.

The dual cryocooler sleeve assembly thus provides a sealed chamber or cavity 44 between vacuum vessel 2 and helium vessel 4 such that cryocooler assembly 12 can be removed from the sleeves while maintaining a vacuum between disconnected joints 13, 38 and 22, 25 and without discontinuing superconducting operation of MRI magnet system 1. Servicing of cryocooler 12 external from MRI magnet system 1, and/or replacement of the cryocooler is accomplished without discontinuing superconducting operation of the MRI magnet system which would in turn cause large quantity liquid helium 6 boiloff due to the direct thermal contact with the recondenser 32 in helium vessel 4 through items 25, 22, 23, 24, 26 and 30. Discontinuance of MRI operation would also result in significant equipment down time with the inability to use the equipment during the down time period, followed by the necessity to replenish liquid helium supply 6, followed by ramping up of magnet system 10 to superconducting operation, and shimming the magnet system 10 to the required field homogeneity, all of which requires considerable time and significant expense which is avoided through use of the present invention. The present invention thus facilitates and readily enables periods of removal of cryocooler 12 for periodic and necessary maintenance and/or replacement while providing at the same time improved contact of the thermal joints and helium recondensing through recondenser 32 positioned directly within helium vessel 4.

After cleaning the thermal contact surfaces of heat sinks 13 and 25 and reinstalling cryocooler 12 sleeve flange 15 secures cryocooler 12 in position to provide good thermal surface contact between the cryocooler and the heat sinks. Subsequent operation of cryocooler 12 will cool heat transfer plates 42 to around 4K to recommence recondensation of helium gas 40, including any helium gas which has accumulated during the period of servicing or replacement of the cryocooler.

The dual sleeve design together with positioning recondensing fins 42 of recondenser 32 within helium vessel 4 using a 4K cryocooler 12 can eliminate the helium loss due to boiloff during normal superconducting operation of magnet 1 and also reduce or eliminate the amount of helium boiloff during the servicing and/or replacement of the cryocooler. In addition, cryocooler 12 can be removed from mobile cryocooler sleeves 18 and 21 as a complete system without exposing internal components of superconducting magnet 10 to atmosphere 45, reducing the risk of contaminating the system during servicing.

While the present invention has been described with respect to certain preferred embodiments thereof, it is to be understood that numerous variations in the details of construction, the arrangement and combination of parts, and the types of materials used may be made without departing from the spirit and scope of the invention.

I claim:

1. A liquid cryogen cooled superconducting magnet assembly suitable for magnetic resonance imaging including cryogen gas recondensing apparatus comprising:

a liquid cryogen vessel to contain a liquid cryogen reservoir to provide cryogenic temperatures to said superconducting magnet assembly for superconducting operation resulting in the formation of cryogen gas;

a closed vacuum vessel surrounding said cryogen vessel and spaced from said cryogen vessel;

a dual-wall cryocooler sleeve assembly including at least one selectively separable thermal joint extending into the space between said helium vessel and said vacuum vessel to form a dual-walled cavity in said closed vacuum vessel for thermally isolating said recondenser from the atmosphere outside said vacuum vessel;

said walls forming a stationary sleeve and mobile sleeve the movement of which breaks said selectively separable thermal joint;

a cryocooler in said cavity in said sleeve assembly;

a cryogen recondenser positioned within said cryogen vessel and thermally connected to said cryocooler;

said recondenser being rendered sufficiently cold to recondense said cryogen gas to liquid cryogen to return to said liquid cryogen reservoir;

said cavity extending through a portion of said vacuum vessel;

said selectively separable thermal joint thermally connecting said cryocooler to said recondenser during operation of said magnet assembly; and means selectively openable to the outside of said superconducting magnet assembly for selective removal of said cryocooler from said cavity including means to break said thermal joints including said selectively separable joint and open the thermal connection between the recondenser and the mobile sleeve.

2. The recondensing superconducting magnet of claim 1 wherein said recondenser chamber includes a plurality of recondensing surfaces thermally connected to said cryocooler when said cryocooler is positioned in said cavity.

3. The recondensing superconducting magnet of claim 2 wherein fastening means are provided to detachably secure said cryocooler to said superconducting magnet within said cavity, and to enable selective removal of said cryocooler while maintaining the vacuum within said vacuum vessel, and further including a bellows the expansion of which enables the breaking of said selectively separable thermal joint while maintaining the integrity of said dual wall sleeve assembly.

4. The recondensing superconducting magnet of claim 3 including a radiation shield in said space between said helium vessel and said vacuum vessel; and said cryocooler being a two stage cryocooler with the first stage thereof thermally connected to said radiation shield, and the second stage thereof thermally connectable to said recondenser to minimize said formation of cryogen gas.

5. The recondensing superconducting magnet of claim 4 wherein at least one flexible thermal coupling of stranded copper cable provides the thermal connection to said radiation shield.

6. The recondensing superconducting magnet of claim 4 wherein thermal heat sinks are provided on said first stage of said cryocooler sleeve and on said radiation shield and said at least one flexible thermal coupling extends between said heat sinks.

7. The recondensing superconducting magnet of claim 4 wherein thermal insulation is provided between said radiation shield and said vacuum vessel.

8. The recondensing superconducting magnet of claim 7 wherein said thermal insulation is aluminized Mylar multilayer superinsulation.

9. The recondensing superconducting magnet of claim 4 wherein said liquid cryogen partially fills said cryogen vessel during operation of said magnet and said cryogen gas rises above the surface level of said liquid cryogen in the region of said recondenser.

10. The recondensing superconducting magnet of claim 2 wherein said cryogen is helium.

11. The recondensing superconducting magnet of claim 2 wherein said liquid cryogen partially fills said cryogen vessel during operation of said superconducting magnet and said recondenser is positioned within said cryogen vessel above the surface level of said liquid cryogen to enable said the recondensed cryogen to fall by gravity back to said liquid cryogen reservoir.

12. The recondensing superconducting magnet of claim 11 wherein the heat sink on said first stage of said cryocooler is a copper collar around said first stage which contacts a mating thermal member on said stationary sleeve to form said at least one selectively separable thermal joint.

13. A helium cooled superconducting magnet assembly suitable for magnetic resonance imaging including helium gas recondensing apparatus comprising:

a helium vessel to contain a liquid helium reservoir to provide cryogenic temperatures to said magnetic resonance imaging magnet assembly for superconducting operation;

a vacuum vessel surrounding said helium vessel and spaced from said helium vessel;

a cryocooler extending into said vacuum vessel;

a helium recondenser in said helium vessel positioned above said liquid helium reservoir and themally connected to said cryocooler;

said recondenser being rendered sufficiently cold to recondense said helium gas to liquid;

a substantially closed dual-wall cavity through said vacuum vessel having a portion selectively openable to the outside of said vacuum vessel for insertion and removal of said cryocooler while maintaining the vacuum within said vacuum vessel;

a heat sink within said cavity remote from said outside with said heat sink thermally connected to said recondenser on the inside of said vacuum vessel, said heat sink being positioned to directly thermally contact the cold end of said cryocooler when said cryocooler is positioned within said cavity and;

said dual wall cavity thermally isolating said helium vessel from the atmosphere and abient temperature outside said magnet assembly by a thermal joint within said dual wall cavity which is broken upon removal of said cryocooler.

14. The helium recondensing superconducting magnet of claim 13 including a radiation shield between said helium vessel and said vacuum vessel; and said cryocooler being a two stage cryocooler with the first stage thereof thermally connected to said radiation shield by flexible thermal braids, and the second stage thereof thermally connected to said helium recondenser through said heat sink.

15. The helium recondensing superconducting magnet of claim 13 wherein said recondenser includes a plurality of recondensing surfaces.

16. The helium recondensing superconducting magnet of claim 15 wherein multi-layer superinsulation thermal insulation is provided between said radiation shield and said vacuum vessel.

17. The helium recondensing superconducting magnet of claim 13 wherein said liquid helium partially fills said helium vessel during operation of said superconducting magnet and said recondenser is positioned in said helium vessel above the surface level of said liquid helium.

* * * * *